(12) United States Patent
Matsuda et al.

(10) Patent No.: US 9,048,399 B2
(45) Date of Patent: Jun. 2, 2015

(54) LIGHT EMITTING DEVICE

(75) Inventors: Naotoshi Matsuda, Chigasaki (JP);
Iwao Mitsuishi, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 374 days.

(21) Appl. No.: 13/037,838

(22) Filed: Mar. 1, 2011

(65) Prior Publication Data
US 2012/0008647 A1    Jan. 12, 2012

(30) Foreign Application Priority Data
Jul. 6, 2010   (JP) ................................ 2010-154032

(51) Int. Cl.
*H01L 33/50* (2010.01)
*C09K 11/77* (2006.01)
*H05B 33/14* (2006.01)

(52) U.S. Cl.
CPC .......... *H01L 33/504* (2013.01); *C09K 11/7734* (2013.01); *C09K 11/7789* (2013.01); *H01L 33/507* (2013.01); *H05B 33/14* (2013.01); *Y02B 20/181* (2013.01)

(58) Field of Classification Search
CPC .... H01L 33/505; H01L 33/501; H01L 33/504
USPC .......................................................... 257/98
See application file for complete search history.

(56) References Cited

U.S. PATENT DOCUMENTS

| | | | |
|---|---|---|---|
| 5,789,856 A * | 8/1998 | Itoh et al. ...................... 313/495 |
| 6,657,379 B2 * | 12/2003 | Ellens et al. .................. 313/503 |
| 6,686,691 B1 * | 2/2004 | Mueller et al. ................ 313/503 |
| 6,936,852 B2 * | 8/2005 | Furukawa et al. .............. 257/79 |
| 7,884,538 B2 | 2/2011 | Mitsuishi et al. | |
| 2009/0045422 A1 * | 2/2009 | Kato et al. ...................... 257/98 |
| 2011/0266584 A1 * | 11/2011 | Sohn et al. ...................... 257/98 |

FOREIGN PATENT DOCUMENTS

| | | |
|---|---|---|
| JP | 2004-71357 A | 3/2004 |
| JP | 2005-277127 | 10/2005 |
| JP | 2009-59896 | 3/2009 |
| JP | 2009-245981 A | 10/2009 |

(Continued)

OTHER PUBLICATIONS

Office Action issued Apr. 17, 2012 in Japanese Patent Application No. 2010-154032 (with English translation).

(Continued)

*Primary Examiner* — Yu-Hsi D Sun
(74) *Attorney, Agent, or Firm* — Oblon, McClelland, Maier & Neustadt, L.L.P.

(57) ABSTRACT

Disclosed is a white light emitting device including a semiconductor light emitting element configured to emit near ultraviolet light having a peak wavelength ranging from 380 to 410 nm, a first phosphor layer and a second phosphor layer. The first phosphor layer contains a blue-emitting phosphor configured to emit blue light by the near ultraviolet light, and a red-emitting phosphor activated by trivalent europium and configured to emit red light by the near ultraviolet light. The second phosphor layer contains a green-emitting phosphor configured to emit green light by the near ultraviolet light. The semiconductor light emitting element, the first phosphor layer and the second phosphor layer are laminated in this order to emit white light.

13 Claims, 4 Drawing Sheets

(56) References Cited

FOREIGN PATENT DOCUMENTS

| | | |
|---|---|---|
| JP | 2010-87267 | 4/2010 |
| JP | 2010-121068 | 6/2010 |
| JP | 2010-129698 | 6/2010 |

OTHER PUBLICATIONS

Office Action issued Aug. 17, 2012, in Japanese Patent Application No. 2010-154032 with English translation.

Office Action issued Sep. 3, 2013, in Japanese Patent Application No. 2010-154032 filed Jul. 6, 2010 (With English-language translation).

* cited by examiner

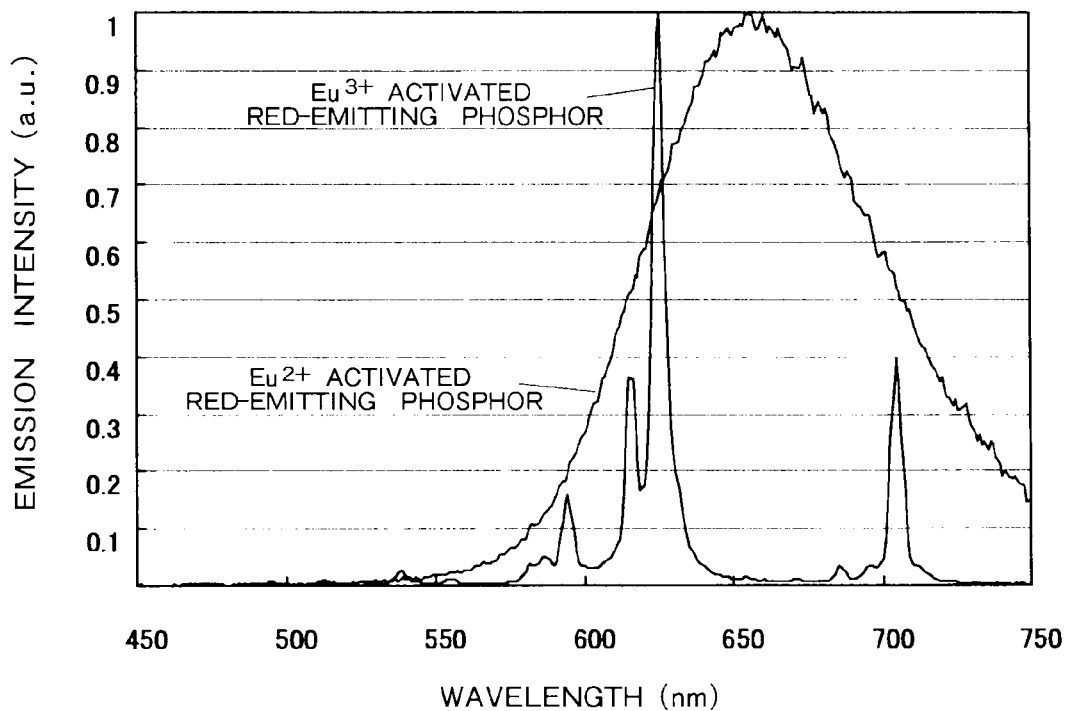
F I G. 1
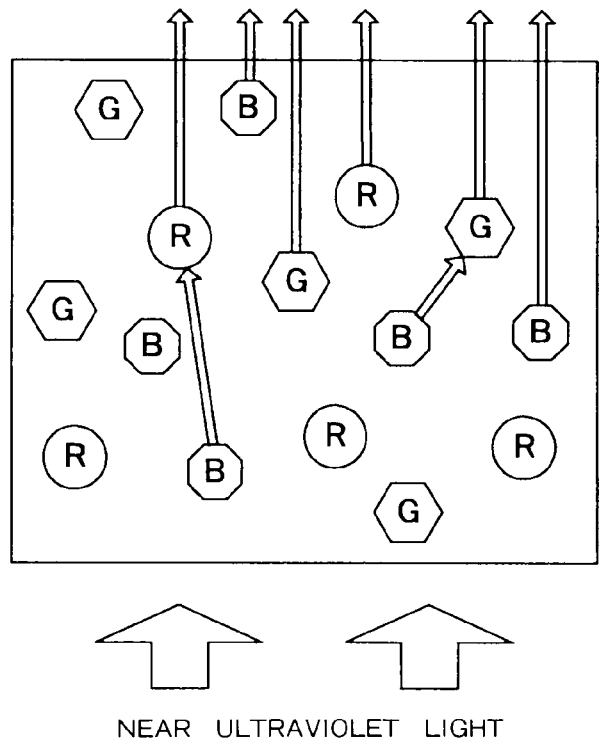
F I G. 2

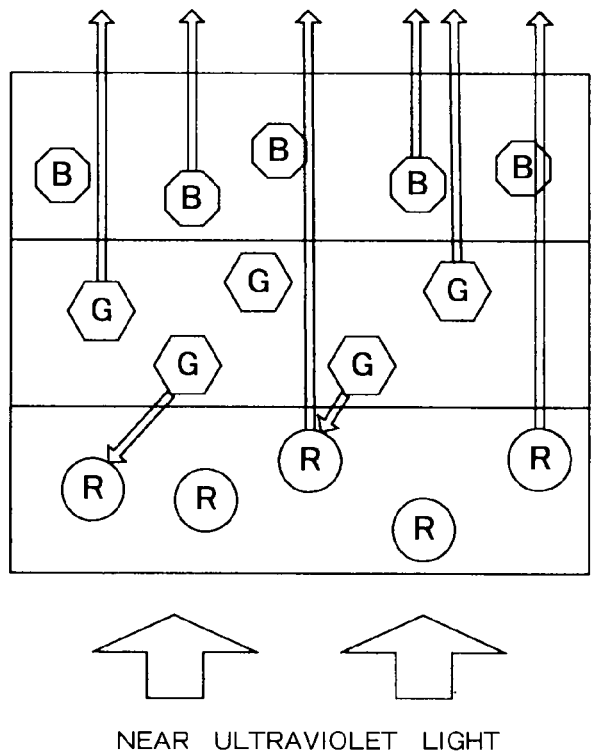
NEAR ULTRAVIOLET LIGHT
F I G. 3
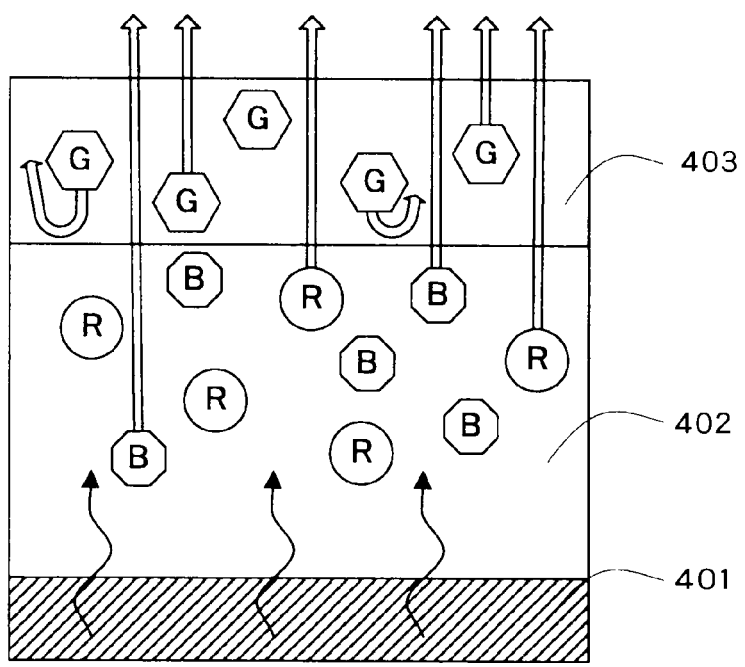
F I G. 4

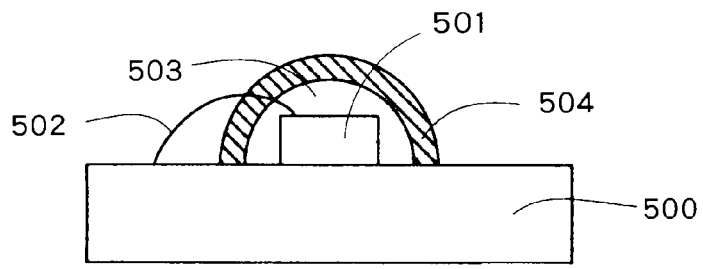
F I G. 5
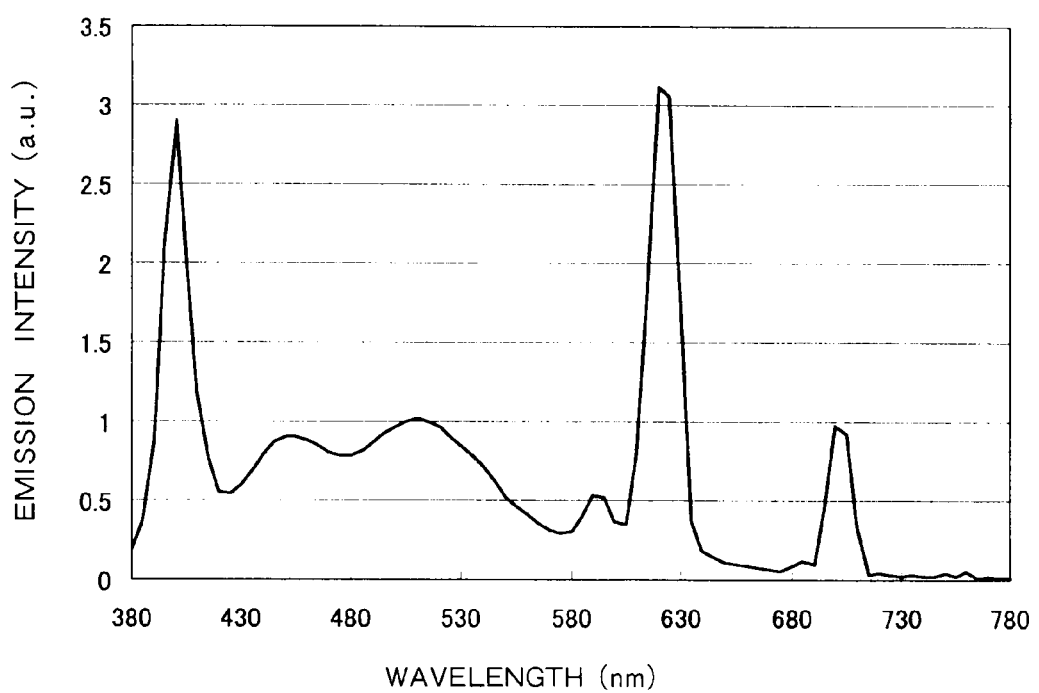
F I G. 6

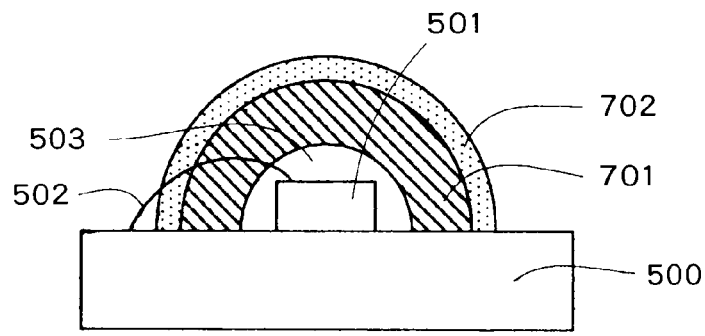
F I G. 7
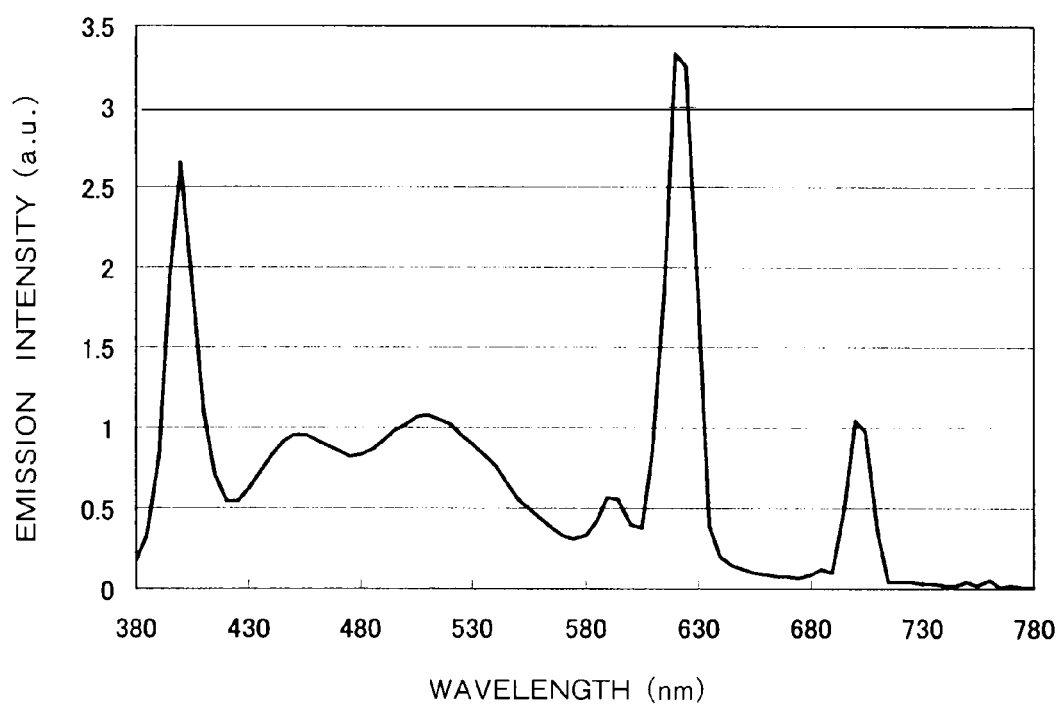
F I G. 8

LIGHT EMITTING DEVICE

CROSS REFERENCE TO RELATED APPLICATIONS

This application is based upon and claims the benefit of priority from the prior Japanese Patent Application No. 2010-154032, filed on Jul. 6, 2010, the entire contents of which are incorporated herein by reference.

FIELD

Embodiments of the present invention relate to a white light emitting device using a semiconductor light emitting element such as a light emitting diode (hereinafter referred to as a "LED").

BACKGROUND

There has been a device configured to emit white light and made up of a combination of a semiconductor light emitting element, such as a blue LED, and a phosphor configured to emit luminescence by light emitted from the LED, and heavy use of this device as an illumination light source is recently made. Such white light emitting devices can be roughly classified into those using a blue LED as an excitation source and those using a near ultraviolet LED as an excitation source.

In a white light emitting device using a blue LED as an excitation source, a blue LED and a yellow-emitting phosphor are combined, or a blue LED, a green-emitting phosphor and a red-emitting phosphor are combined, so that white light is generated. However, part of emission of a blue LED is used as a component of white light emitted from the device. Therefore, the device is readily affected by the unevenness in characteristics of the blue LED, and the emission spectrum can be controlled in the limited wavelength range by the phosphor. These make it difficult to control color rendering properties in the case of using the device as an illumination light source. Accordingly, there has been room for improvement. On the other hand, in a white light emitting device using a near ultraviolet LED having a wavelength around 400 nm as an excitation source, white light can be made up of a combination of phosphors of three kinds, that is, blue-emitting, green-emitting and red-emitting. Therefore, this device has advantages in that control of the emission spectrum is relatively easy, and that a light source having high color rendering properties is readily obtained in the case of using the device for illumination applications.

In the case of using a near ultraviolet LED as an excitation source, a phosphor activated by divalent europium ($Eu^{2+}$), such as $BaMgAl_{10}O_{17}$:Eu or $(Ba,Sr,Ca,Mg)_{10}(PO_4)_6Cl_2$:Eu, is known as an example that can be used as a blue-emitting phosphor. As an example of a green-emitting phosphor, a phosphor activated by divalent europium ($Eu^{2+}$), such as $(Sr,Ba)_2SiO_4$:Eu, $SrGa_2S_4$:Eu, $Ba_3Si_6O_{12}N_2$:Eu or $Sr_3Si_{13}Al_3O_2N_2$:Eu is known. Further, as a red-emitting phosphor, a phosphor activated by $Eu^{2+}$, such as $CaAlSiN_3$:Eu or $(Sr, Ca)_2Si_5N_8$:Eu, and a phosphor activated by trivalent europium ($Eu^{3+}$), such as $La_2O_2S$:Eu. Among these phosphors, many red-emitting phosphors activated by $Eu^{2+}$ give high light emitting efficiencies even when excited by near ultraviolet LEDs. However, the red-emitting phosphors exhibit strong absorption in the visible light region. Therefore, there is room for improvement in that light applied from the white light emitting device is colored reddish, and that it is difficult to design the amount of coating when a desired spectrum is to be obtained.

On the other hand, a red-emitting phosphor activated by $Eu^{3+}$ and a red-emitting phosphor activated by $Eu^{2+}$ exhibit completely different emission spectra as illustrated in FIG. 1. The emission spectrum of a red-emitting phosphor activated by $Eu^{3+}$ has characteristics that most of emission energy is concentrated within the wavelength range from 600 to 630 nm. Therefore, regarding this red-emitting phosphor, the emission components are reduced in a wavelength range of low efficacy that is positioned on the side of a wavelength longer than this wavelength range. Consequently, this red-emitting phosphor can achieve an emission spectrum that is advantageous in terms of sectral luminous efficacy even if the total sum of its emission energy is equal to that of the red-emitting phosphor activated by $Eu^{2+}$. From such reasons, red-emitting phosphors activated by $Eu^{3+}$ such as $Y_2O_3$:Eu and $Y_2O_2S$:Eu have conventionally been used as major red-emitting phosphors for use in fluorescent lamps and color cathode-ray tubes. Further, a $Eu^{3+}$-activated red-emitting phosphor has small light absorption in the visible light region, and therefore its spectrum design is relatively easy, which can reduce coloring of a white light emitting device that is remarkable in the case of using a red-emitting phosphor activated by $Eu^{2+}$. However, compared to a red-emitting phosphor activated by $Eu^{2+}$, absorption of the $Eu^{3+}$-activated red-emitting phosphor with respect to near ultraviolet excitation light is generally weak, which leads to an inferior light emitting efficiency of a white light emitting device. This has been problematic.

Several kinds, not one kind, of structure of a white light emitting device using a plurality of phosphors are known. For example, the simplest structure uses a phosphor layer in which a plurality of phosphors are dispersed in a mixed form in a resin within the same layer. To attain a higher light emitting efficiency, there is proposed a white light emitting device using a three-layer structure phosphor layer in which the longer the wavelength of a phosphor, the closer to the excitation LED the phosphor is, whereas the shorter the wavelength of a phosphor, the farther from the excitation LED the phosphor is. Further, there is proposed a white light emitting device using a two-layer structure phosphor layer in which a first layer containing a red-emitting phosphor and a second layer containing a green-emitting phosphor and a blue-emitting phosphor laminated on an excitation source. However, because of reabsorption by phosphors, and the like, any conventionally known white light emitting device has not yet achieved a sufficient light emitting efficiency. It has been desired to attain a higher light emitting efficiency.

BRIEF DESCRIPTION OF THE DRAWINGS

FIG. 1 illustrates representative emission spectra of red-emitting phosphors;

FIG. 2 is a schematic illustration of a cross-sectional structure of a white light emitting device made of a single phosphor layer;

FIG. 3 is a schematic illustration of a cross-sectional structure of a white light emitting device made up of three phosphor layers;

FIG. 4 is a schematic illustration of a cross-sectional structure of a white light emitting device according to an embodiment of the invention;

FIG. 5 is a cross-sectional view of a white light emitting device of comparative example 1;

FIG. 6 illustrates an emission spectrum of the white light emitting device of comparative example 1;

FIG. 7 is a cross-sectional view of a white light emitting device of example 1; and FIG. 8 illustrates an emission spectrum of the white light emitting device of example 1.

DETAILED DESCRIPTION

Embodiments will now be explained with reference to the accompanying drawings.

A light emitting device according to an embodiment of the invention includes a semiconductor light emitting element configured to emit near ultraviolet light having a peak wavelength ranging from 380 to 410 nm, a first phosphor layer and a second phosphor layer. The first phosphor layer contains a blue-emitting phosphor configured to emit blue light by the near ultraviolet light, and a red-emitting phosphor activated by trivalent europium and configured to emit red light by the near ultraviolet light. The second phosphor layer contains a green-emitting phosphor configured to emit green light by the near ultraviolet light. The semiconductor light emitting element, the first phosphor layer and the second phosphor layer are laminated in this order to emit white light.

A white light emitting device according to the embodiment of the invention includes, as an excitation source, a semiconductor light emitting element that emits near ultraviolet light. In order to allow an $Eu^{3+}$-activated red-emitting phosphor to be excited and enable a high light emitting efficiency to attain, a semiconductor light emitting element whose peak wavelength ranges from 380 to 410 nm is selected for use in the white light emitting device. As such a semiconductor light emitting element, a near ultraviolet light emitting diode (near ultraviolet LED) is preferable. In addition, a semiconductor laser diode that oscillates in this wavelength range can be used.

Any blue-emitting phosphors and any green-emitting phosphors that are excited by near ultraviolet light emitted from the semiconductor light emitting element to emit blue light and green light, respectively, can be used, and they are not particularly limited.

Examples of such blue-emitting phosphors include $BaMgAl_{10}O_{17}$:Eu and $(Ba,Sr, Ca,Mg)_{10}(PO_4)_6Cl_2$:Eu.

Also, examples of such green-emitting phosphors include $(Sr,Ba)_2SiO_4$:Eu, $SrGa_2S_4$:Eu, $Ba_3Si_6O_{12}N_2$:Eu, $Sr_3Si_{13}Al_3O_2N_{21}$:Eu, $BaMgAl_{10}O_{17}$:Eu,Mn, $(Sr,Ca,Ba)(Al, Ga)_2S_4$:Eu and ZnS:Cu,Al. Among these phosphors, green-emitting phosphors activated by $Eu^{2+}$ are preferable.

Further, red-emitting phosphors that can be used in the embodiment of the invention are phosphors activated by $Eu^{3+}$. Among such phosphors, europium-activated rare-earth oxysulfide phosphors are preferable, and europium-activated lanthanum oxysulfide phosphors are more preferable. These phosphors are preferable because their excitation efficiencies with respect to near ultraviolet light are high. Specific examples of such phosphors include $La_2O_2S$:Eu and $Y_2O_2S$:Eu. Among them, $La_2O_2S$:Eu is most preferable. In addition, if red-emitting phosphors are activated by $Eu^{3+}$, they may include other ions as necessary. For example, red-emitting phosphors that contain activating ions other than $Eu^{3+}$, such as $Y_2O_2S$:$Eu^{3+}$,$Bi^{3+}$ and $YVO_4$:$Eu^{3+}$,$Bi^{3+}$, may be used.

It is to be noted that, the terms "blue-emitting phosphor", "green-emitting phosphor" and "red-emitting phosphor" as used in the invention mean phosphors whose wavelength peaks of light emitted upon excitation lie between 430 and 490 nm, between 490 and 580 nm and between 590 and 630 nm, respectively. Also, the term "white color" as used in the invention means emission color close to a blackbody radiation locus. Specifically, color in a chromaticity range defined by the color range of warm white or daylight color prescribed in Japanese Industrial Standard (JIS) Z 9112 is referred to as "white color" in the invention.

The white light emitting device according to the embodiment of the invention includes the aforementioned semiconductor light emitting element configured to emit near ultraviolet light, the first phosphor layer and the second phosphor layer laminated in this order. A $Eu^{3+}$-activated red-emitting phosphor and a blue-emitting phosphor are contained in the first phosphor layer, and a green-emitting phosphor is contained in the second phosphor layer.

Each phosphor layer can be formed by dispersing predetermined phosphor powder in a solution or a fused material of a transparent resin, such as an epoxy resin or a silicone resin, and applying the powder onto a substrate on which a semiconductor light emitting element is disposed, or the like, followed by curing. In such a way, the amount of application of a phosphor per unit area can be controlled by changing the amount of the phosphor added to the resin and the coating layer thickness of the phosphor layer.

It is to be noted that other layers can be provided as necessary in addition to the first phosphor layer and the second phosphor layer in the white light emitting device according to the embodiment of the invention. That is, arbitrary layers, such as a layer for evenly diffusing light emitted from the semiconductor light emitting element in the first phosphor layer, and a layer for protecting the surface of the device, can be added. These layers are formed between the semiconductor light emitting element and the first phosphor layer, between the first and second phosphor layers, on the surface of the second phosphor layer, or the like.

A white light emitting device according to the embodiment of the invention achieves a high light emitting efficiency compared to a conventional light emitting device. The reason for this is assumed as follows.

The structure of a light emitting device having a single-layer structure, which is the simplest structure, is as illustrated in FIG. 2. That is, blue-emitting phosphors B, green-emitting phosphors G and red-emitting phosphors R are mixed in a single layer. The phosphors are each excited by near ultraviolet light from an excitation source to emit light of their respective colors. However, for example, light emitted from the blue-emitting phosphor B is sometimes absorbed to the green-emitting phosphor G and the red-emitting phosphor R that exist at nearby positions. That is, the emission from a phosphor that emits light of a short wavelength has a high probability of being reabsorbed into a phosphor that emits light of a long wavelength. Usually, part of light energy absorbed into a phosphor is converted into thermal energy. Therefore, if reabsorption is repeated, reduction in light emitting efficiency tends to be remarkable.

As a way of preventing reduction in light emitting efficiency, a multilayered structure where phosphors are separated into independent layers is known. The schematic illustration of a multilayered-structure light emitting device is illustrated in FIG. 3. However, it has been found by discussions of the present inventors that a sufficiently high light emitting efficiency cannot be achieved by such a way. The reason for this is considered as follows. In cases where a phosphor emits light when excited, luminescence has no directionality, and therefore, although about half of the luminescence is emitted onto a surface from which emission is to be extracted, about the other half is emitted to the opposite side. For example, in FIG. 3, in cases where the green-emitting phosphors G emit light when excited, half of the emission is emitted toward a blue-emitting phosphor layer, and the remaining half is emitted toward a red-emitting phosphor layer. The blue-emitting phosphors B do not absorb green emission, and therefore the green emission is reduced very little and is emitted from an optical device. However, if the red-emitting phosphors R are activated by $Eu^{2+}$, such red-emitting phosphors R exhibit optical absorption in the visible light region, and therefore reabsorption occurs. As a result, improvement in light emitting efficiency of the entire device is not very large.

On the other hand, in cases where the red-emitting phosphors R activated by $Eu^{3+}$ are used, optical absorption in the visible light region is small, and therefore such red-emitting phosphors R do not often absorb emission from the green-emitting phosphors G. However, the $Eu^{3+}$-activated red-emitting phosphors R absorb little near ultraviolet light, which is excitation light, and therefore the red emission becomes weak. As a result, the effect of improvement of the entire light emitting efficiency cannot be sufficiently increased.

The present inventors have found that, as regard to such issues, the white light emitting device according to the embodiment of the invention uses red-emitting phosphors activated by $Eu^{3+}$ and further employs a layer configuration that is completely different from a conventional layer configuration, so that improvement in light emitting efficiency of a white light emitting device can be attained. That is, the schematic view of the white light emitting device according to the embodiment of the invention is just as illustrated in FIG. 4, in which a semiconductor light emitting element 401 configured to emit near ultraviolet light, a first phosphor layer 402 and a second phosphor layer 403 are laminated in this order. The reason why such a structure can attain a high light emitting efficiency has not yet been sufficiently elucidated. Nonetheless, the reason is considered as follows. While the phosphors are separated into two layers for reabsorption to be reduced, when the green phosphors G contained in the second phosphor layer emit light by near ultraviolet light from the semiconductor light emitting element, the emission is reflected from the surface of the first phosphor layer containing the blue-emitting phosphors B and the red-emitting phosphors R.

The white light emitting device according to the embodiment of the invention can be a light emitting device having any conventionally known shape. For example, a light emitting device can be of any one of the following types: a dome type, a shell type, a package cup type and a surface mounting type. Also, these white light emitting devices can be used for various illumination equipment or portable devices, personal computer (PC) peripheral devices, office automation (OA) devices, various switches, backlight light sources and various display devices such as display boards.

Specific examples of the invention will be described in detail below with reference to the drawings.

Comparative Example 1

A dome type light emitting device having a cross-sectional structure illustrated in FIG. 5 was fabricated as comparative example 1. A near ultraviolet LED chip 501 having a peak at a wavelength of 400 nm was mounted on a package 500, predetermined wiring was made with a gold wire 502, and the chip was hemispherically covered with a transparent silicone resin 503 containing no phosphor. Next, blue-emitting phosphors $BaMgAl_{10}O_{17}$:Eu, green-emitting phosphors $Sr_3Si_{13}Al_3O_2N_{21}$:Eu and red-emitting phosphors $La_2O_2S$:Eu were blended to be at a weight ratio of 34:3:63 and were mixed and dispersed in a silicone resin. Then, the phosphors were applied onto the aforementioned hemispherical transparent silicone resin to be a nearly even thickness and were cured, so that the phosphor layer 504 containing three kinds of phosphors was formed. Thus, the white light emitting device of the comparative example 1 was fabricated. The emission spectrum of the light emitting device was just as illustrated in FIG. 6, and the chromaticity (0.35, 0.35) was close to a correlated color temperature of approximately 5000 K.

Example 1

Next, a dome type light emitting device having a cross-sectional structure illustrated in FIG. 7 was made as example 1. Like comparative example 1, the near ultraviolet LED chip 501 was hemispherically covered with the transparent silicone resin 503 containing no phosphor. On top of this, a first phosphor layer 701 obtained by mixing and dispersing the blue-emitting phosphors $BaMgAl_{10}O_{17}$:Eu and the red-emitting phosphors $La_2O_2S$:Eu in a silicone resin and applying and curing the phosphors, and a second phosphor layer 702 obtained by mixing and dispersing green-emitting phosphors $Sr_3Si_{13}Al_3O_2N_{21}$:Eu in a silicone resin and applying and curing the phosphors were sequentially formed. Thus, a white light emitting device was fabricated. A prototype was made while the phosphor-blending ratio and thickness of each phosphor layer were varied. Specifically, the mixing ratio between blue-emitting phosphors and red-emitting phosphors was 37:63, the coating thickness of the first phosphor layer containing these phosphors was 70% of that of the phosphor layer of comparative example 1. Further, with the amount of mixing phosphors with respect to the silicone resin being 1/10 of the case of comparative example 1, green phosphors were dispersed in the resin, and the thickness of the second phosphor layer containing green phosphors was 70% of that of the phosphor layer of comparative example 1. Under these conditions, a white light emitting device of example 1 exhibiting an emission spectrum illustrated in FIG. 8 with the same chromaticity of (0.35, 0.35) as comparative example 1 was obtained. The emission luminance of this white light emitting device had a high value accounting for 107% of that of comparative example 1.

Comparative Example 2

For the purpose of comparison, a white light emitting device was fabricated in which a semiconductor light emitting element, a phosphor layer (a first layer) containing only red-emitting phosphors, and a phosphor layer (a second layer) containing green-emitting phosphors and blue-emitting phosphors are laminated in this order. The thickness of the first layer was 30% of that of the phosphor layer of comparative example 1, the mixing ratio between the green-emitting phosphors and the blue-emitting phosphors was 6:94, and the thickness of the second layer was 67% of that of the phosphor layer of comparative example 1. Under these conditions, emission of the same chromaticity of (0.35, 0.35) as in comparative example 1 was obtained. This white light emitting device was defined as comparative example 2. The emission luminance of this white light emitting device was 103% of that of comparative example 1.

Reference Examples 1 and 2

A light emitting device having a single layer structure as in comparative example 1 was fabricated using $CaAlSiN_3$:Eu activated by $Eu^{2+}$ as red-emitting phosphors. This was defined as a light emitting device of reference example 1. Further, a light emitting device having a two-layer structure as in example 1 was fabricated using $CaAlSiN_3$:Eu activated by $Eu^{2+}$. This was defined as a light emitting device of reference example 2. The emission luminance of the light emitting device of reference example 2 was only 47% of that of reference example 1. From this, it was found that effects of the invention could not be obtained if red-emitting phosphors out of the scope of the invention were used for a light emitting device of a structure specified in the invention.

From the results described above, the structure of a light emitting device is such that a semiconductor light emitting element, a first phosphor layer containing a red-emitting phosphor and a blue-emitting phosphor, and a green-emitting phosphor are laminated in this order, and further a red-emitting phosphor activated by $Eu^{3+}$ is used as the red-emitting phosphor. Thus, it is possible to obtain a white light emitting device that achieves a higher light emitting efficiency.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A light emitting device comprising:
a semiconductor light emitting element configured to emit near ultraviolet light having a peak wavelength ranging from 380 to 410 nm;
a first phosphor layer containing a blue-emitting phosphor configured to emit blue light by the near ultraviolet light, said blue-emitting phosphor being selected from the group consisting of $BaMgAl_{10}O_{17}$:Eu and $(Ba,Sr,Ca,Mg)_{10}(PO_4)_6Cl_2$:Eu, and a red-emitting phosphor activated by trivalent europium and configured to emit red light by the near ultraviolet light, said red-emitting phosphor being an europium-activated lanthanum oxysulfide phosphor, said first phosphor layer formed as a homogeneous layer containing both said blue-emitting phosphor and said red-emitting phosphor throughout said first phosphor layer; and
a second phosphor layer containing a green-emitting phosphor configured to emit green light by the near ultraviolet light, said green-emitting phosphor being selected from the group consisting of $(Sr,Ba)_2SiO_4$:Eu, $SrGa_2S_4$:Eu, $Ba_3Si_6O_{12}N_2$:Eu, $Sr_3Si_{13}Al_3O_2N_{21}$:Eu and $(Sr,Ca,Ba)(Al,Ga)_2S_4$:Eu,
the semiconductor light emitting element, the first phosphor layer and the second phosphor layer being laminated in this order to emit white light.

2. The device of claim 1, wherein the blue light has a wavelength peak ranging from 430 to 490 nm when excited.

3. The device of claim 1, wherein the green-emitting phosphor is a phosphor activated by divalent europium.

4. The device of claim 1, wherein the green light has a wavelength peak ranging from 490 to 580 nm when excited.

5. The device of claim 1, wherein the red-emitting phosphor is $La_2O_2S$:Eu.

6. The device of claim 1, wherein the red light has a wavelength peak ranging from 590 to 630 nm when excited.

7. The device of claim 1, wherein the first phosphor layer and the second phosphor layer are each formed by dispersing powder of the respective phosphors in a solution or a fused material of an epoxy resin or a silicone resin and applying the powder onto a substrate on which the semiconductor light emitting element is disposed, or the like, followed by curing.

8. The device of claim 1, further comprising a layer for evenly diffusing light emitted from the semiconductor light emitting element in the first phosphor layer.

9. The device of claim 1, further comprising a layer for protecting a surface.

10. The device of claim 1, wherein the semiconductor light emitting element is a near ultraviolet light emitting diode.

11. The device of claim 1, wherein the semiconductor light emitting element is a semiconductor laser diode.

12. The device of claim 1, wherein light in a chromaticity range defined by color ranges of warm white or daylight color prescribed in Japanese Industrial Standard (JIS) Z 9112 is emitted.

13. The device of claim 1 having shape of any one of a dome type, a shell type, a package cup type and a surface mounting type.

* * * * *